(12) United States Patent
Chou et al.

(10) Patent No.: US 9,111,957 B2
(45) Date of Patent: Aug. 18, 2015

(54) COUPLING WELL STRUCTURE FOR IMPROVING HVMOS PERFORMANCE

(71) Applicant: Taiwan Semiconductor Manufacturing Company, Ltd., Hsin-Chu (TW)

(72) Inventors: Hsueh-Liang Chou, Jhubei (TW); Chen-Bau Wu, Zhubei (TW); Weng-Chu Chu, Qionglin Shiang (TW); Tsung-Yi Huang, Hsin-Chu (TW); Fu-Jier Fan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 14/030,784

(22) Filed: Sep. 18, 2013

(65) Prior Publication Data

US 2014/0045304 A1 Feb. 13, 2014

Related U.S. Application Data

(60) Division of application No. 13/280,035, filed on Oct. 24, 2011, now Pat. No. 8,592,923, which is a continuation of application No. 12/887,300, filed on Sep. 21, 2010, now Pat. No. 8,049,295, which is a continuation of application No. 12/362,307, filed on Jan. 29, 2009, now Pat. No. 7,816,214, which is a continuation of application No. 11/594,508, filed on Nov. 8, 2006, now abandoned.

(60) Provisional application No. 60/852,183, filed on Oct. 17, 2006.

(51) Int. Cl.
| | |
|---|---|
| *H01L 21/336* | (2006.01) |
| *H01L 29/66* | (2006.01) |
| *H01L 29/10* | (2006.01) |
| *H01L 29/36* | (2006.01) |
| *H01L 29/78* | (2006.01) |
| *H01L 29/861* | (2006.01) |
| *H01L 21/28* | (2006.01) |

(52) U.S. Cl.
CPC .......... *H01L 29/66477* (2013.01); *H01L 21/28* (2013.01); *H01L 29/1045* (2013.01); *H01L 29/36* (2013.01); *H01L 29/66128* (2013.01); *H01L 29/66659* (2013.01); *H01L 29/7835* (2013.01); *H01L 29/8611* (2013.01)

(58) Field of Classification Search
USPC ......... 438/179, 286, 298, 414, 545, 549, 965; 257/E21.417
See application file for complete search history.

(56) References Cited

U.S. PATENT DOCUMENTS

| | | | |
|---|---|---|---|
| 4,063,278 | A | 12/1977 | Hutson |
| 5,912,493 | A | 6/1999 | Gardner et al. |
| 6,265,752 | B1 | 7/2001 | Liu et al. |
| 7,372,104 | B2 | 5/2008 | Wu et al. |
| 2001/0020720 | A1 | 9/2001 | Hueting et al. |
| 2006/0170060 | A1 | 8/2006 | Wu et al. |
| 2007/0132033 | A1 | 6/2007 | Wu et al. |

OTHER PUBLICATIONS

Plummer, J.D. et al., "Silicon VLSI Technology, Fundamentals, Practice and Modeling," Prentice Hall Electronics and VLSI Series, 2000, pp. 17-18.

*Primary Examiner* — Chandra Chaudhari
(74) *Attorney, Agent, or Firm* — Slater & Matsil, L.L.P.

(57) ABSTRACT

A semiconductor structure includes a substrate, a first well region of a first conductivity type overlying the substrate, a second well region of a second conductivity type opposite the first conductivity type overlying the substrate, a cushion region between and adjoining the first and the second well regions, an insulation region in a portion of the first well region and extending from a top surface of the first well region into the first well region, a gate dielectric extending from over the first well region to over the second well region, wherein the gate dielectric has a portion over the insulation region, and a gate electrode on the gate dielectric.

22 Claims, 7 Drawing Sheets

COUPLING WELL STRUCTURE FOR IMPROVING HVMOS PERFORMANCE

This application is a divisional of U.S. patent application Ser. No. 13/280,035, filed Oct. 24, 2011, and entitled "Coupling Well Structure for Improving HVMOS Performance," which application is a divisional of U.S. patent application Ser. No. 12/887,300, filed Sep. 21, 2010, and entitled "Coupling Well Structure for Improving HVMOS Performance," now U.S. Pat. No. 8,049,295, which patent is a continuation of U.S. patent application Ser. No. 12/362,307, filed Jan. 29, 2009, and entitled "Coupling Well Structure for Improving HVMOS Performance," now U.S. Pat. No. 7,816,214, which patent is a continuation of U.S. patent application Ser. No. 11/594,508, filed Nov. 8, 2006, and entitled "Coupling Well Structure for Improving HVMOS Performance," which claims the benefit of U.S. Provisional Application No. 60/852,183, filed on Oct. 17, 2006, entitled "Coupling Well Structure for Improving HVMOS Performance," which applications are hereby incorporated herein by reference.

TECHNICAL FIELD

This invention relates generally to semiconductor devices, and more particularly to metal-oxide-semiconductor (MOS) devices, and even more particularly to the structure and manufacturing methods of high-voltage MOS devices.

BACKGROUND

High-voltage metal-oxide-semiconductor (HVMOS) devices are widely used in many electrical devices, such as input/output (I/O) circuits, CPU power supplies, power management systems, AC/DC converters, etc. HVMOS devices typically include drain regions and laterally-diffused drain regions enclosing drain regions. Laterally-diffused drain regions are typically well regions having lower doping concentrations than the drain regions, thus having high breakdown electrical fields.

FIG. 1 illustrates a conventional HVNMOS device 2, which includes gate oxide 10, gate electrode 12 on gate oxide 10, drain region 6 in n-well region 4, and source region 8 in p-well region 7. Shallow trench isolation (STI) region 14 spaces drain region 6 apart from gate electrode 12 so that a high drain-to-gate voltage can be applied.

It is known that high electrical fields are typically generated at interface regions. For HVNMOS device 2, when a high voltage is applied between drain region 6 and source region 8, a high electrical field is generated at a region proximate p-n junction 16, which becomes the weak point of the HVNMOS device 2. The generation of the high electrical field causes the reduction in breakdown voltage of HVMOS device 2. This problem worsens when the device dimensions become smaller, and thus the electrical fields become higher.

Novel methods for reducing electrical fields at p-n junctions are thus needed to improve breakdown voltages of high-voltage MOS devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention are described with reference to FIGS. 1 through 7. Variations of the preferred embodiments are then discussed. Throughout the various views and illustrative embodiments of the present invention, like reference numbers are used to designate like elements.

Figure 1:
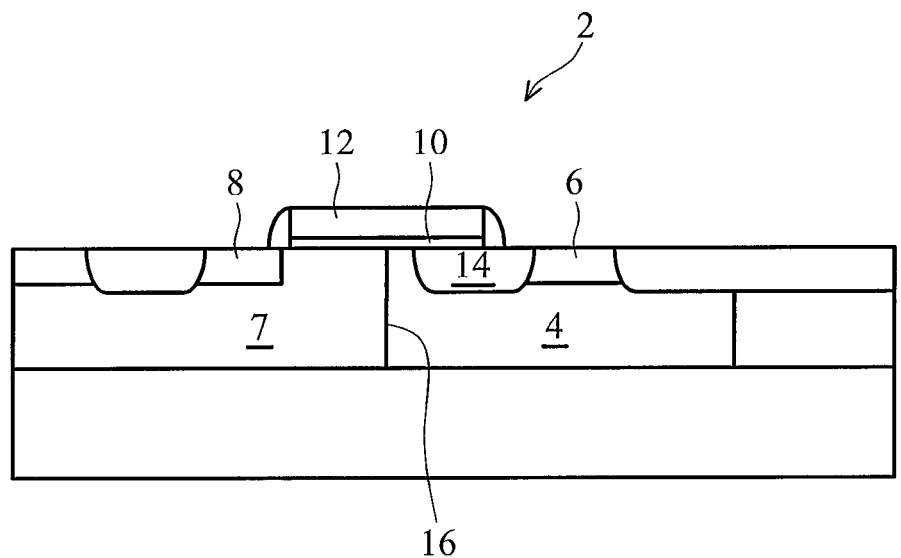
FIG. 1 illustrates a conventional HVNMOS device.
Figure 2:
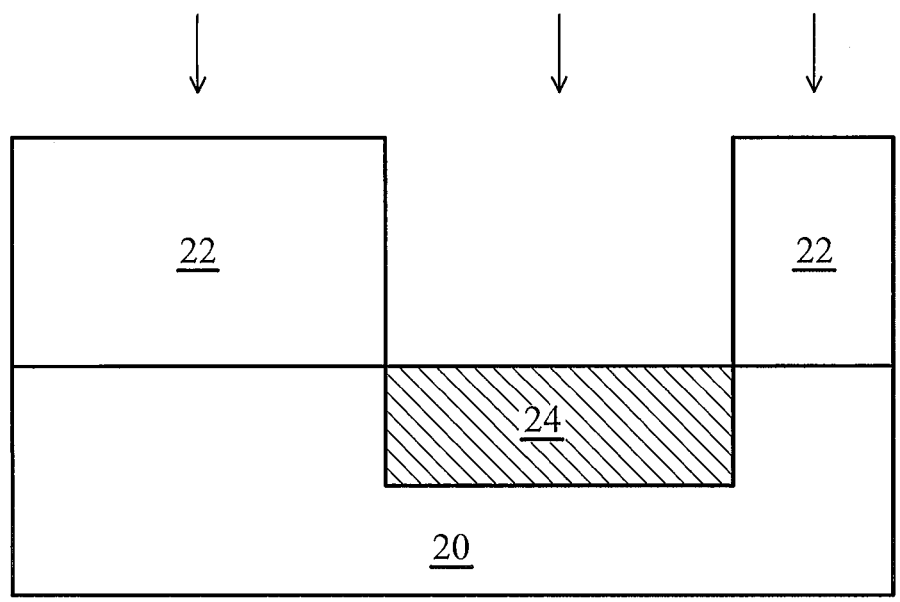
FIGS. 2 through 7 are cross-sectional views of intermediate stages in the manufacture of a first embodiment of the present invention, wherein a cushion region is formed by overlapping a p-well region and an n-well region.

Referring to FIG. 2, substrate 20 is provided. Substrate 20 preferably includes a semiconductor material such as silicon, SiGe, or a compound of group III and group IV elements. Substrate 20 may be a bulk material or have a silicon-on-insulator (SOI) structure. Preferably, substrate 20 is lightly doped with a p-type impurity, although it can also be doped with an n-type impurity.

FIG. 2 also illustrates the formation of n-well region 24. Photoresist 22 is first applied and patterned. In the preferred embodiment, n-well region 24 is implanted with n-type impurities, such as phosphorous and/or arsenic. Preferably, n-well region 24 is a high-voltage n-well region, which has a low impurity concentration. In alternative embodiments, n-well region 24 is a low-voltage n-well (LVNW) region that is formed simultaneously with the formation of the n-well regions of low-voltage PMOS devices (not shown). In an exemplary embodiment, the n-type impurity concentration in n-well region 24 is between about $10^{14}/cm^3$ to about $10^{17}/cm^3$. After the formation of n-well region 24, photoresist 22 is removed.

Figure 3A:
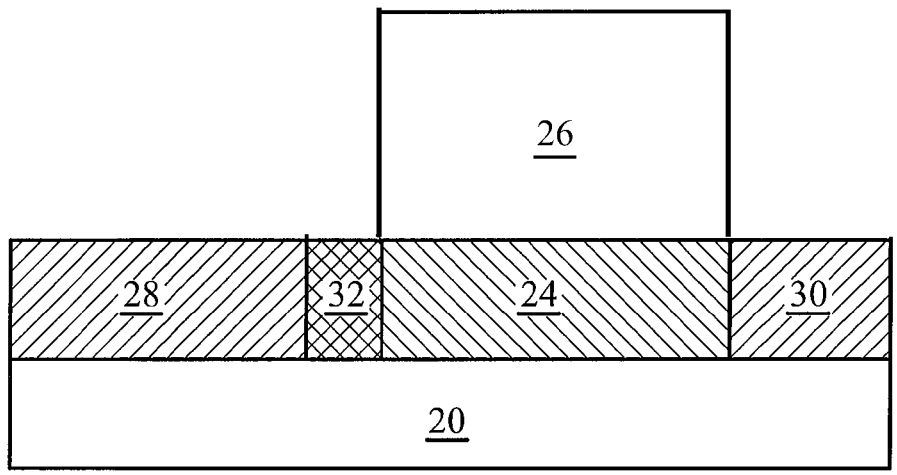

Referring to FIG. 3A, photoresist 26 is applied, and p-well regions 28 and 30 are formed, which are implanted with p-type impurities, such as boron and/or indium. Preferably, p-well regions 28 and 30 are high-voltage n-well regions with a low impurity concentration. In alternative embodiments, p-well regions 28 and 30 are low-voltage p-well (LVPW) regions that are formed simultaneously with the formation of the p-well regions of low-voltage NMOS devices (not shown). In an exemplary embodiment, the p-type impurity concentration in p-well regions 28 and 30 is between about $10^{14}/cm^3$ to about $10^{17}/cm^3$. After the formation of p-well regions 28 and 30, photoresist 26 is removed.

Figure 3B:
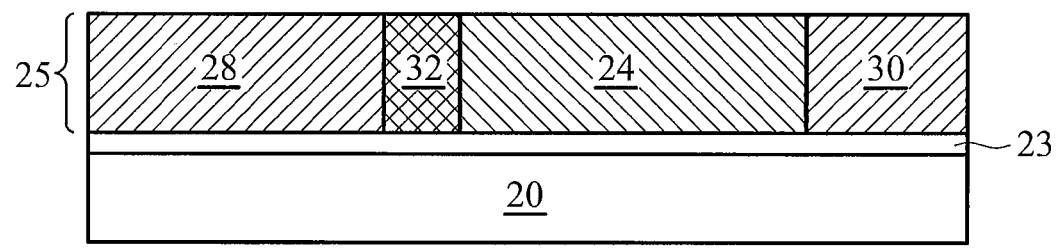

In the embodiments discussed in preceding paragraphs, p-well regions 28 and 30 and n-well region 24 are formed by implanting substrate 20. In alternative embodiments, the well regions are formed by epitaxial growth. In an exemplary embodiment, as shown in FIG. 3B, an N+ buried layer (NBL) 23 is formed in a top region of the substrate 20. NBL 23 is preferably formed by implanting or in-situ doping impurities into the top surface of substrate 20. For example, antimony and/or arsenic may be implanted or in-situ doped to an impurity concentration of about $10^{16}/cm^3$ to about $10^{18}/cm^3$.

An epitaxial layer 25 is then epitaxially grown on NBL 23. Epitaxial layer 25 preferably comprises a semiconductor such as silicon, and more preferably the same material as substrate 20, and is preferably doped with one of the p-type and n-type impurities. Assuming p-type impurities are doped, the impurity concentration is then equal to the desired concentration of p-well regions 28 and 30. A photoresist (not shown) is then formed and patterned, exposing region 24. An n-type impurity implantation is then performed. The implanted n-type impurity neutralizes the p-type impurities in epitaxial layer 25 and converts the implanted region to n-well region 24. Un-implanted epitaxial regions thus form p-well regions 28 and 30. Alternatively, the epitaxial layer 25 may be doped with n-type impurities when grown, and implanted with p-type impurities.

In both FIGS. 3A and 3B, p-well region 28 and n-well region 24 have an overlap region 32, which is referred to as cushion region 32 hereinafter. Preferably, width C of cushion region 32 is between about 10 Å and about 3 μm, and more preferably between about 0.3 μm and about 0.5 μm.

Figure 4:
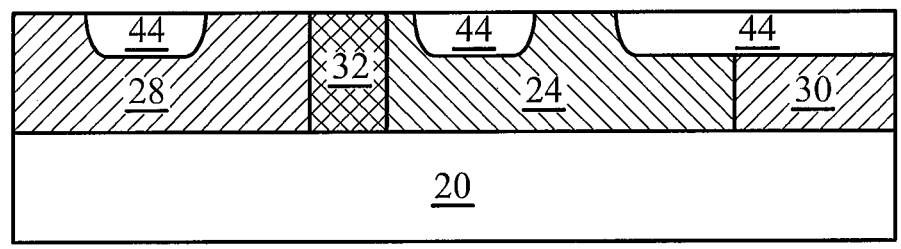

FIG. 4 illustrates the formation of insulation regions 44. In the preferred embodiment, insulation regions 44 are formed by forming shallow trenches, filling the trenches with a dielectric material, such as high-density plasma (HDP) oxide, and performing a chemical mechanical polish to remove excess dielectric material. The resulting shallow trench isolation (STI) regions are insulation regions 44. In other embodiments, a mask layer (not shown), for example, a SiN layer, is formed over the previously formed structure. The mask layer is then patterned to form openings. An oxidation is then performed, and insulation regions (also referred to as field oxides) 44 are formed in the openings.

Figure 5:
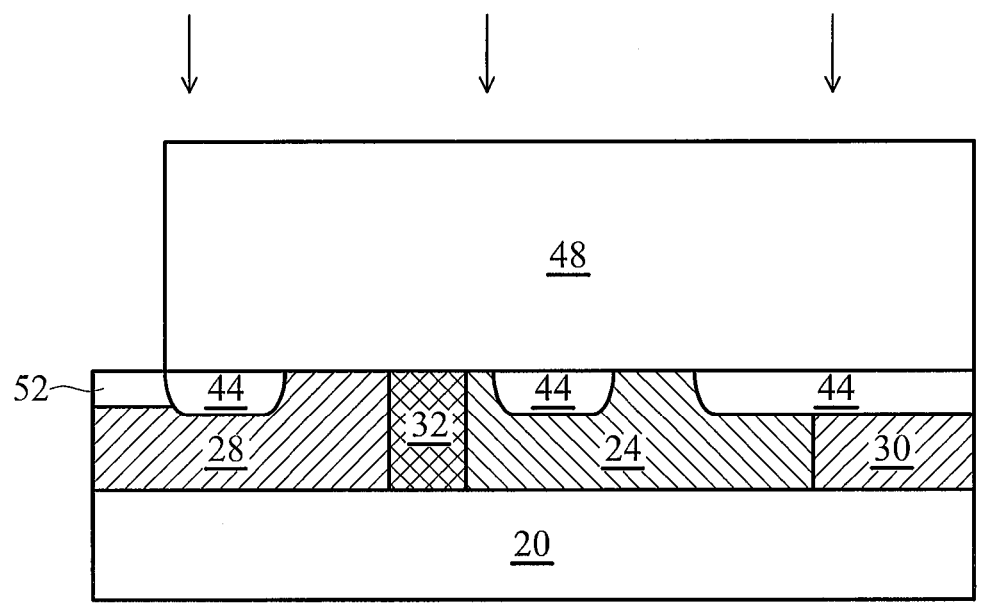

Referring to FIG. 5, photoresist 48 is applied and patterned. A p-type impurity implantation is performed, forming P+ region 52. Preferably, P+ region 52 comprises boron and/or other p-type impurities, and is heavily doped to a concentration of greater than about $10^{20}/cm^3$. P+ region 52 may act as the pick-up region of the p-well region 28. After the implantation, photoresist 48 is removed.

Figure 6:
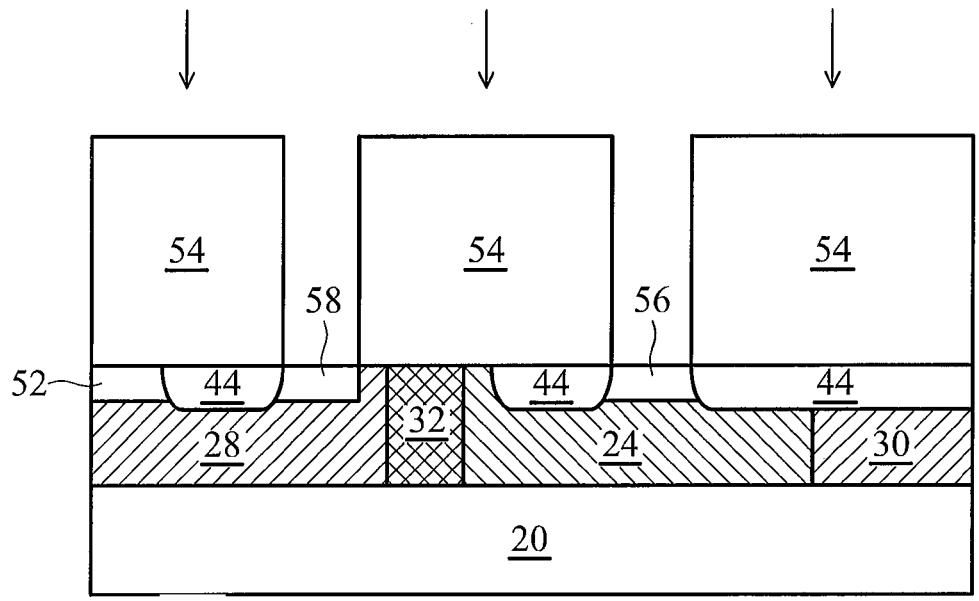

Referring to FIG. 6, photoresist 54 is applied and patterned, and an n-type impurity implantation is performed, forming N+ regions 56 and 58. The implanted impurities may comprise phosphorus and/or arsenic. Preferably, the n-type impurities are heavily doped to a concentration of greater than about $10^{20}/cm^3$. N+ regions 56 and 58 act as a drain contact region and source region, respectively. Photoresist 54 is then removed.

Alternatively, N+ regions 56 and 58 may be formed before the formation of P+ region 52, or formed after the formation of gate dielectric, gate electrode and gate spacers. One skilled in the art will realize the respective process steps.

Figure 7:
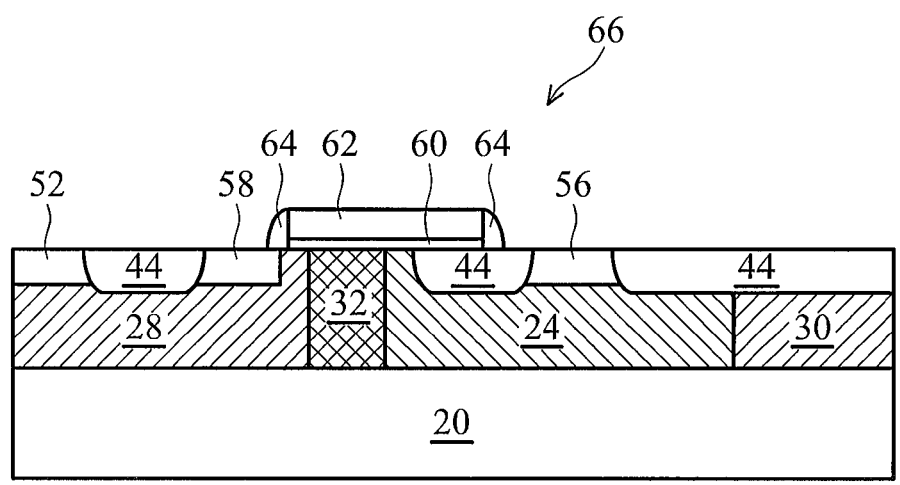

FIG. 7 illustrates the formation of gate dielectric 60, gate electrode 62 and gate spacers 64. As is known in the art, gate dielectric 60 preferably comprises silicon oxide, although other dielectric materials such as silicon nitride, silicon carbide, silicon oxynitride, combinations thereof, and multilayers thereof, can be used. Gate electrode 62 preferably includes doped polysilicon. Alternatively, metals, metal nitrides, metal silicides, and other conductive materials can be used. Gate spacers 64 are preferably formed by blanket forming a dielectric material, and removing undesired portions from horizontal surfaces. The details for forming gate dielectric 60, gate electrode 62 and gate spacers 64 are well known in the art, and thus are not repeated herein. Preferably, an edge of gate electrode 62 is located directly over insulation region 44 in n-well region 24. HVNMOS device 66 is thus formed.

Figure 8:
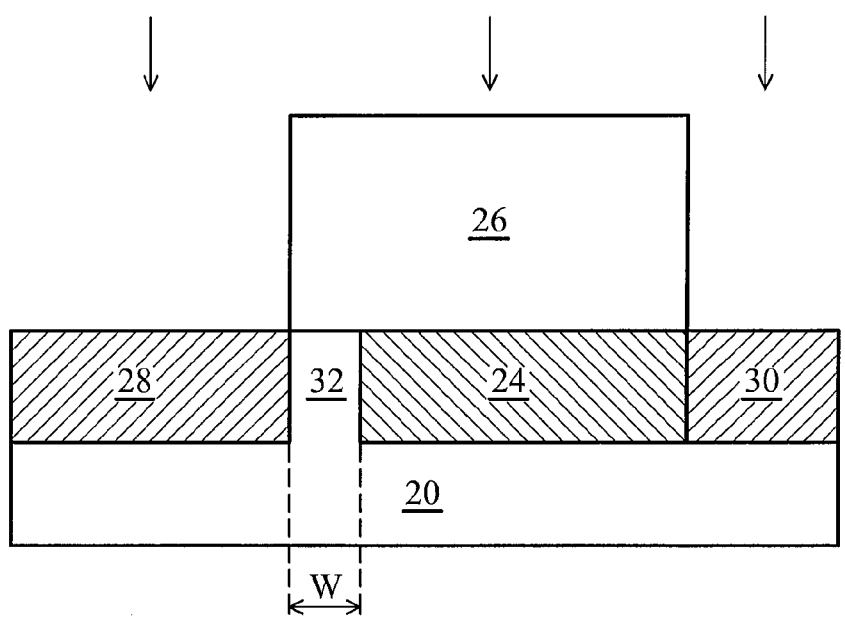
FIGS. 8 and 9 illustrate a second embodiment of the present invention, wherein a cushion region formed by spacing a p-well region apart from an n-well region.
Figure 9:
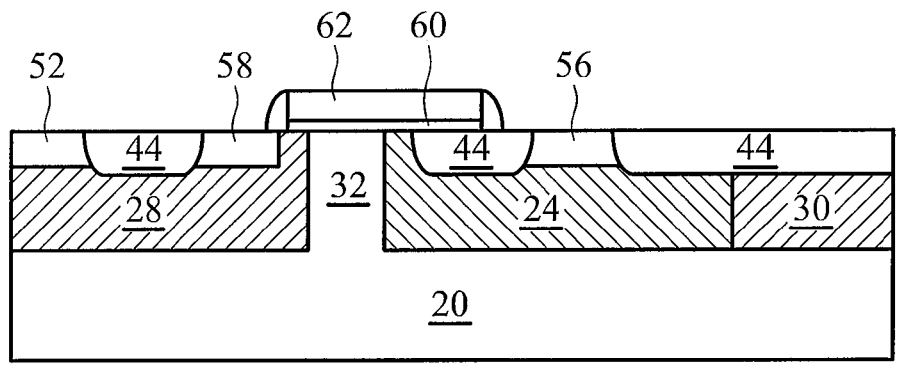

A second embodiment of the present invention is illustrated in FIGS. 8 and 9. This embodiment is similar to the embodiment shown in FIG. 7, except that cushion region 32 is a space between p-well region 28 and n-well region 24. In an exemplary embodiment, a structure as shown in FIG. 2 is formed. Photoresist 26, as shown in FIG. 8 is then formed for the formation of p-well regions 28 and 30. P-well region 28 and n-well region 24 are thus spaced apart, forming cushion region 32. It is to be realized that impurities in n-well region 24 and p-well region 28 are likely to diffuse into cushion region 32. However, the diffused impurity concentration will be low compared to the impurity concentrations in respective n-well region 24 and p-well region 28. In an exemplary embodiment, the p-type and n-type impurities diffuse into cushion region 32 and form a p-n junction therein. The ratios of p-type and n-type impurities concentration at the p-n junction to the p-type and n-type impurities in respective n-well region 24 and p-well region 28 are likely to be less than ⅕, even less than 0.1. With an adequate width W of cushion region 32, the ratios may even be less than about 0.01. Similar to the first embodiment, width C of cushion region 32 is preferably between about 10 Å and about 3 μm, and more preferably between about 0.3 μm and about 0.5 μm.

Figure 10:
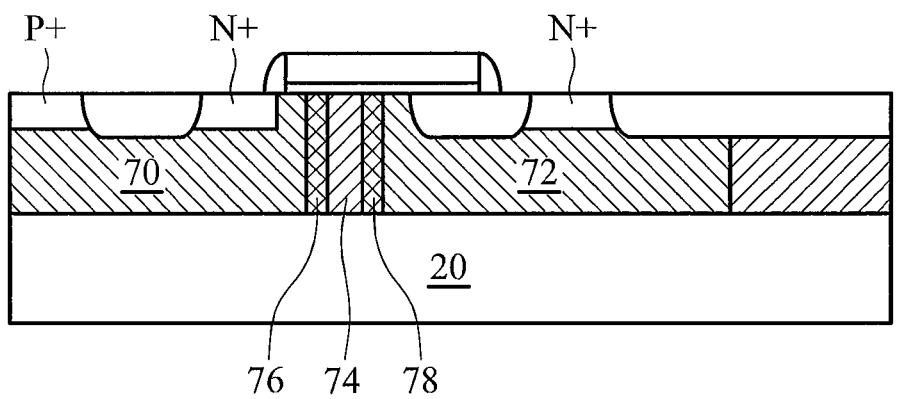
FIG. 10 illustrates a symmetric embodiment of the present invention.

The previously illustrated embodiments have asymmetric structures, wherein source and drain regions are in well regions with different conductivity types. FIG. 10 illustrates a HVNMOS embodiment having a symmetric structure, wherein the HVNMOS device includes two n-well regions 70, 72 and a p-well region 74 therebetween. Similar to the embodiment illustrated in FIG. 7, cushion regions 76 and 78 are formed, wherein each of the cushion regions 76 and 78 may be an overlap region or a spacing between the neighboring p-well and n-well regions. In alternative embodiments, p-well region 74 only overlaps (or spaced apart from) one of the n-well regions 70 and 72, so that only one of the cushion regions 76 and 78 are formed, while a conventional interface is formed between p-well region 74 and the other adjacent n-well region.

Although the preferred embodiments illustrate the formation of HVNMOS devices, one skilled in the art will realize the respective formation steps for forming HVPMOS devices, with the conductivity type of n-well region 24, p-well regions 28 and 30, and N+ regions 56 and 58, etc., reversed (refer to FIGS. 7 and 9). It should also be appreciated that HVMOS devices have various different layouts. However, the concept of the present invention may still be applied. Similarly, a symmetric HVPMOS device may be formed by reversing the conductivity types of the doped regions in FIG. 10.

Besides forming HVMOS devices, the concept of forming a cushion region to affect the distribution of electrical fields may be applied to the formation of other devices, such as diodes. By forming cushion regions between p-type and n-type regions of p-n junctions, the breakdown voltage of diodes can be improved.

Figure 11:
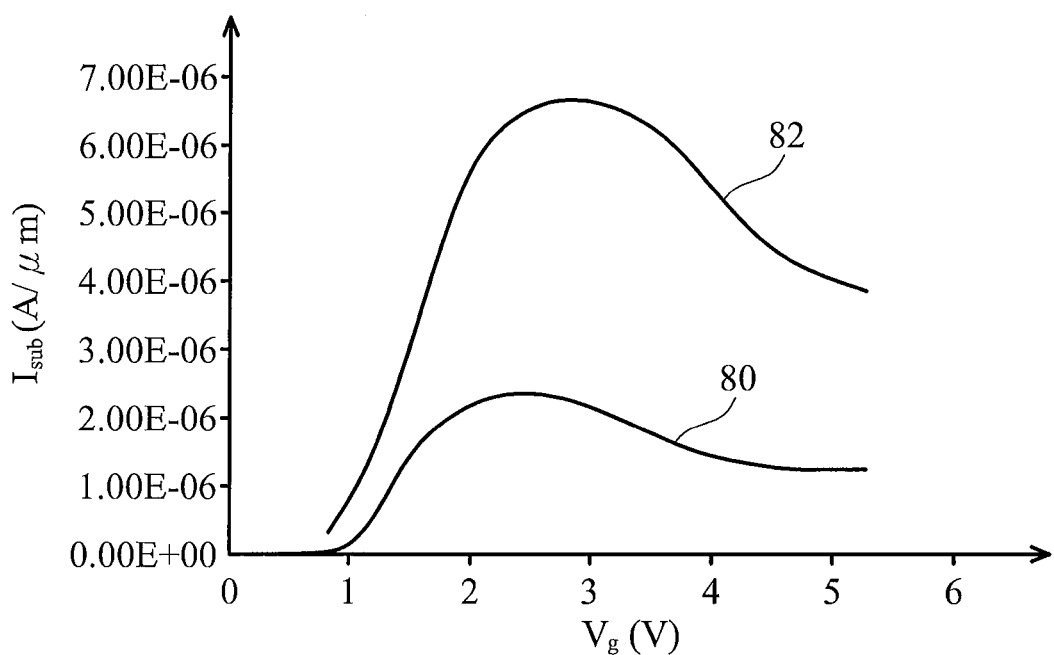
FIG. 11 illustrates a comparison between substrate currents of a conventional high-voltage MOS device and an embodiment of the present invention.

An advantageous feature of the present invention is that n-well region 24 and p-well region 28 are separated from each other by cushion region 32. Inside cushion region 32, the net impurity concentration is low. In the embodiment shown in FIG. 7, in cushion region 32, the p-type impurities and n-type impurities neutralize each other, and thus the net impurity concentration is reduced. In the embodiment shown in FIG. 9, cushion region 32 is not doped during the formation of well regions, and thus the impurity concentration is low. Therefore, the cushion region 32 form an interface region with lower net impurity concentrations, and thus the performance of the HVMOS devices is improved. Experiments have revealed that the breakdown voltages of the embodiment of the present invention are improved about 3 volts to about 5 volts over the breakdown voltages of conventional HVMOS devices with similar structures (except no cushion regions are formed). In addition, as is shown in FIG. 11, substrate currents Isub of embodiments of the present invention are significantly lower than substrate currents of conventional HVMOS devices. The Isub of an embodiment of the present invention is illustrated as line 80, which has a maximum Isub of about only 2E-06 A/μm, while Isub of a conventional HVMOS device is illustrated as line 82, which has a maximum Isub of about 6.5E-06 A/μm. As is known in the art, the lifetime of HVMOS devices is strongly related to Isub. With Isub reduced, the lifetime of HVMOS devices will be increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure, the method comprising:
   forming and patterning a first photo resist over a substrate;
   forming a first well region of a first conductivity type overlying the substrate using the first photo resist, wherein the first photo resist covers a selected region over the substrate;
   removing the first photo resist;
   forming and patterning a second photo resist over the substrate;
   forming a second well region of a second conductivity type opposite the first conductivity type overlying the substrate using the second photo resist, wherein the second photo resist covers the selected region, and wherein the first well region and the second well region are horizontally spaced apart from each other by the selected region;
   forming an insulation region in a portion of the first well region and extending from a top surface of the first well region into the first well region;
   forming a gate dielectric extending from over the first well region to over the second well region, wherein the gate dielectric has an edge directly over the insulation region; and
   forming a gate electrode on the gate dielectric.

2. The method of claim 1, wherein the selected region has a width between about 10Å and about 3μm.

3. The method of claim 2, wherein the width is between about 0.3μm and about 0.5μm.

4. The method of claim 1, wherein the first conductivity type is p-type.

5. The method of claim 1, wherein the first conductivity type is n-type.

6. The method of claim 1 further comprising forming a third well region of the first conductivity type overlying the substrate, wherein the third well region is on an opposite side of the second well region than the first well region.

7. The method of claim 1, wherein the selected region is horizontally spaced apart from the insulation region by a portion of the first well region.

8. The method of claim 1, wherein the substrate comprises a material selected from the group consisting essentially of silicon, SiGe, a compound of group III and group IV elements, and combinations thereof.

9. The method of claim 1, wherein the substrate is a silicon-on-insulator substrate.

10. The method of claim 1 further comprising:
    forming a drain region in the first well region, the drain region adjoining the insulation region; and
    forming a source region in the second well region.

11. The method of claim 10 further comprising:
    forming gate spacers on sidewalls of the gate electrode, one of the gate spacers directly over a portion of the source region.

12. A method of forming a semiconductor structure, the method comprising:
    forming a first well region of a first conductivity type over a substrate;
    forming a second well region of a second conductivity type opposite the first conductivity type over the substrate, the second well region and the first well region being laterally spaced apart from each other by a first portion of the substrate;
    forming a first insulation region in the first well region and a second insulation region in the second well region;
    forming a pickup region of the second conductivity type in the second well region, the pickup region having a higher dopant impurity concentration than the second well region, the pickup region adjoining the second insulation region;
    forming a drain region in the first well region, the drain region adjoining the first insulation region;
    forming a source region in the second well region, the source region adjoining the second insulating region, the second insulation region being interposed between the pickup region and the source region;
    forming a gate dielectric directly over the first well region, the second well region, a portion of the first insulation region, and the first portion of the substrate; and
    forming a gate electrode on the gate dielectric.

13. The method of claim 12, wherein the first portion of the substrate has a width between about 0.3μm and about 3μm.

14. The method of claim 12, wherein the first portion of the substrate has a width between about 0.3μm and about 0.5μm.

15. The method of claim 12, wherein an entirety of the first portion of the substrate is directly underlying, and vertically overlapping, the gate dielectric and the gate electrode.

16. The method of claim 12, wherein the first portion of the substrate comprises dopants from the first and the second well regions.

17. The method of claim 16, wherein the first portion of the substrate comprises a region lightly doped with impurities relative to the first and second well regions.

18. A method of forming a semiconductor structure, the method comprising:
- forming and patterning a first photo resist over a substrate, the substrate including a semiconductor wafer;
- forming a first well region of a first conductivity type over the substrate using the first photo resist, wherein the first photo resist covers a cushion region over the substrate;
- removing the first photo resist;
- forming and patterning a second photo resist over the substrate;
- forming a second well region of a second conductivity type opposite the first conductivity type over the substrate using the second photo resist, wherein the second photo resist covers the cushion region, and wherein the first well region and the second well region are horizontally spaced apart from each other by the cushion region;
- forming an insulation region in the first well region;
- forming a gate dielectric directly over the first well region, the second well region, a portion of the insulation region, and the cushion region; and
- forming a gate electrode on the gate dielectric.

19. The method of claim 18, wherein the cushion region has a dopant impurity concentration of from about one percent to about twenty percent of a dopant impurity concentration of the first well region.

20. The method of claim 18 further comprising:
- forming a drain region in the first well region, the drain region adjoining the insulation region;
- forming a source region in the second well region; and
- forming a pickup region of the second conductivity type in the second well region, the pickup region having a higher dopant impurity concentration than the second well region.

21. The method of claim 12 further comprising forming a third well region of the first conductivity type over the substrate, wherein the third well region is on an opposite side of the second well region than the first well region.

22. The method of claim 12, wherein:
- the forming the first well region further comprises:
  - forming and patterning a first photo resist over the substrate;
  - forming the first well region of a first conductivity type over the substrate using the first photo resist, wherein the first photo resist covers the first portion of the substrate; and
  - removing the first photo resist; and
- the forming the second well region further comprises:
  - forming and patterning a second photo resist over the substrate;
  - forming the second well region of the second conductivity type over the substrate using the second photo resist, wherein the second photo resist covers the first portion of the substrate; and
  - removing the second photo resist.

* * * * *